(12) United States Patent
Lau et al.

(10) Patent No.: US 6,624,405 B1
(45) Date of Patent: Sep. 23, 2003

(54) BIST FOR TESTING A CURRENT-VOLTAGE CONVERSION AMPLIFIER

(75) Inventors: Anthony Lau, Los Altos, CA (US); Dan Ion Hariton, Pinole, CA (US)

(73) Assignee: Capella Microsystems, Inc., San Jose, CA (US)

( * ) Notice: Subject to any disclaimer, the term of this patent is extended or adjusted under 35 U.S.C. 154(b) by 0 days.

(21) Appl. No.: 09/294,235

(22) Filed: Apr. 19, 1999

(51) Int. Cl.[7] .............................................. H01J 40/14
(52) U.S. Cl. ............................ 250/214 LA; 250/214 A
(58) Field of Search ..................... 250/214 LA, 214 A, 250/214 R, 214.1; 356/221; 257/48; 327/514; 330/59

(56) References Cited

U.S. PATENT DOCUMENTS

| | | | |
|---|---|---|---|
| 3,936,725 A | * 2/1976 | Schneider | .................... 323/315 |
| 4,498,001 A | 2/1985 | Smoot | |
| 4,550,284 A | * 10/1985 | Sooch | ........................ 323/315 |
| 4,792,997 A | 12/1988 | Toussaint et al. | |
| 4,872,195 A | 10/1989 | Leonard | |
| 4,924,096 A | 5/1990 | Mroczkowski et al. | |
| 5,230,000 A | * 7/1993 | Mozingo et al. | ........... 371/22.4 |
| 5,267,323 A | 11/1993 | Kimura | |
| 5,329,115 A | * 7/1994 | Lim | ........................ 250/214 R |
| 5,425,011 A | 6/1995 | Kusano et al. | |
| 5,585,731 A | 12/1996 | Tsuchida et al. | |
| 5,589,777 A | 12/1996 | Davis et al. | |
| 5,598,143 A | 1/1997 | Wentz | |
| 5,606,277 A | * 2/1997 | Feliz | .......................... 327/311 |

OTHER PUBLICATIONS

Steffes, Michael, "Here's An Easy Way To Test Wideband Transimpedance Amplifiers," *Electronic Design*, Jun. 8, 1998, pps. 74–80.

Park, S.M. et al., "Low Noise Current–Mode CMOS Transimpedance Amplifier For GIGA–Bit Optical Communication," *IEEE*, (1998) pps. I–293 to I–296.

* cited by examiner

*Primary Examiner*—Zandra V Smith
(74) *Attorney, Agent, or Firm*—Parsons Hsue & de Runtz LLP

(57) ABSTRACT

A dual function circuit for providing an output voltage to a transimpedance amplifier is disclosed. The dual function circuit can be selected between functioning as a current to voltage conversion circuit connected to a photodiode and as a testing circuit for testing the transimpedance amplifier without exposing light to the photodiode. The dual function circuit comprises two current mirror pairs to ensure that a substantially similar dc bias current is applied to the two driving transistors. In addition, by applying an input testing voltage to the two driving transistors in a common gate/base design, the output of the testing circuit has wide band frequency response. No switching is required to select between the test mode and the normal mode.

16 Claims, 7 Drawing Sheets

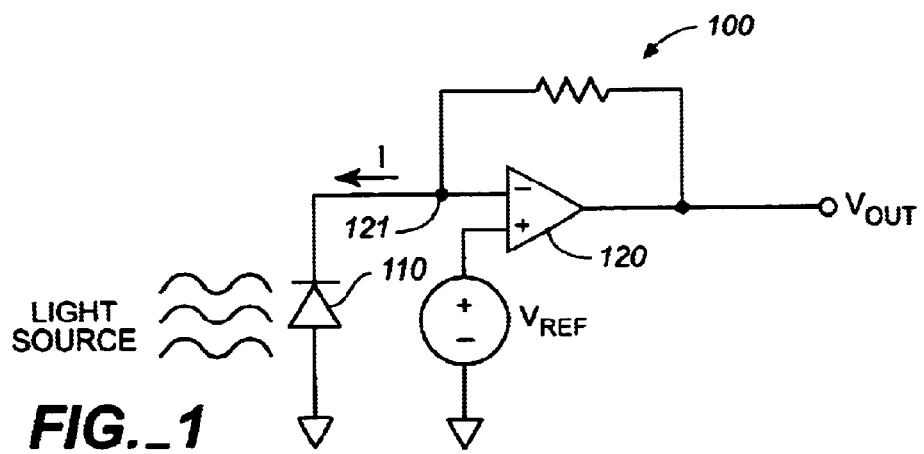
FIG._1
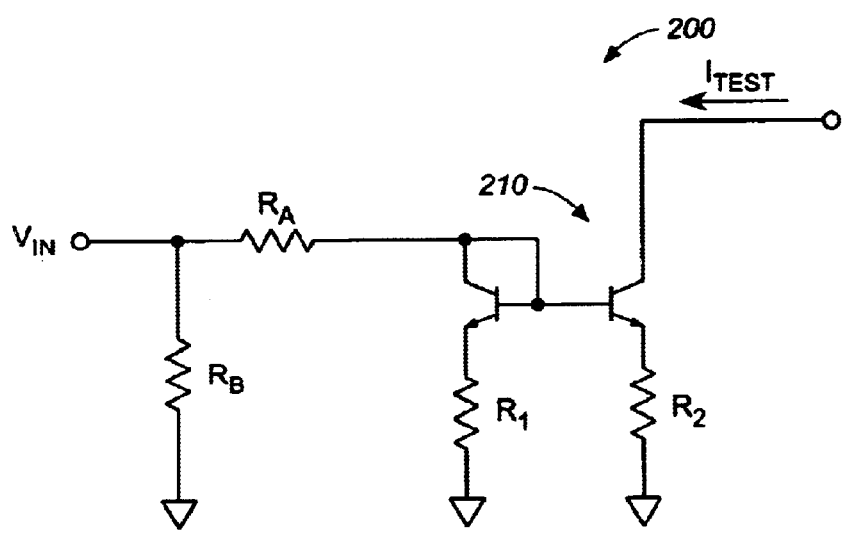
FIG._2
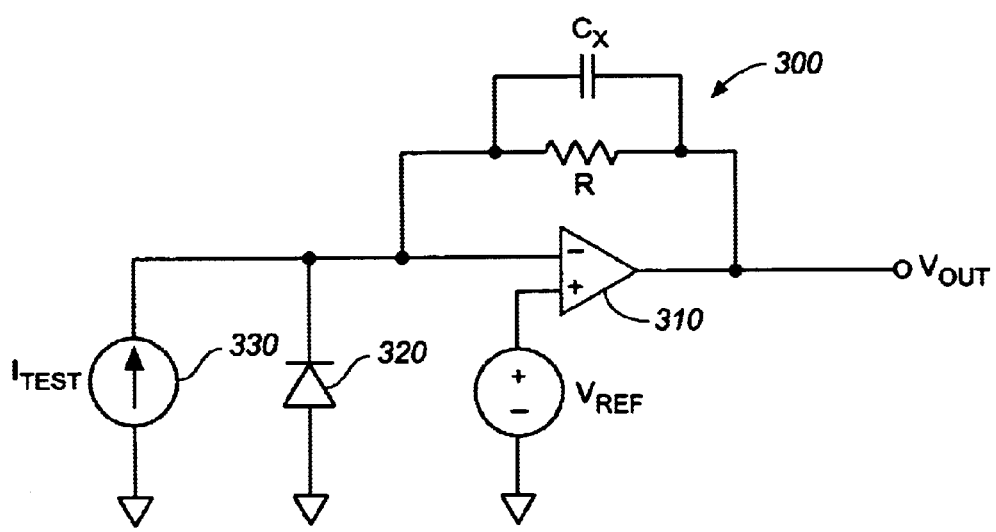
FIG._3

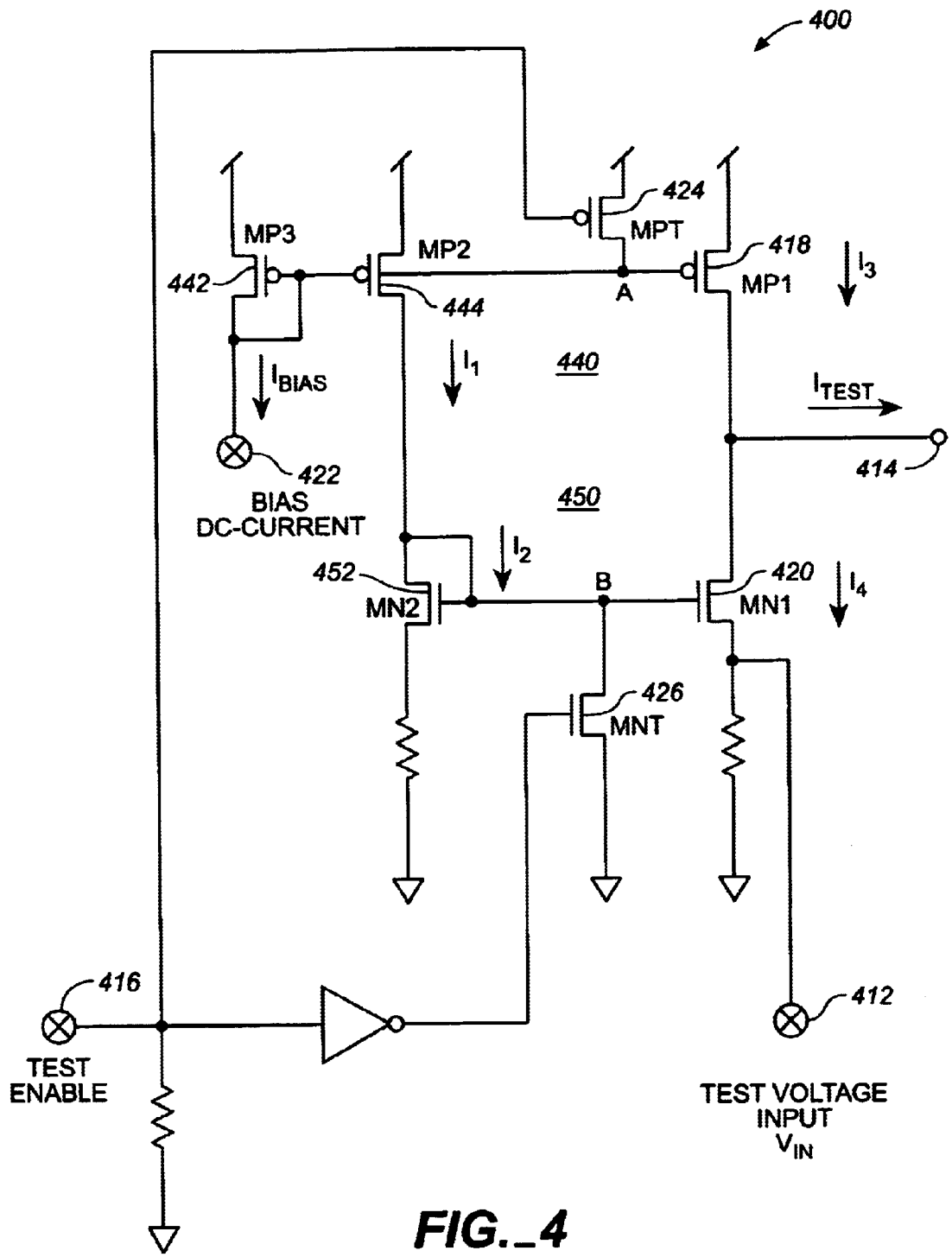
FIG._4

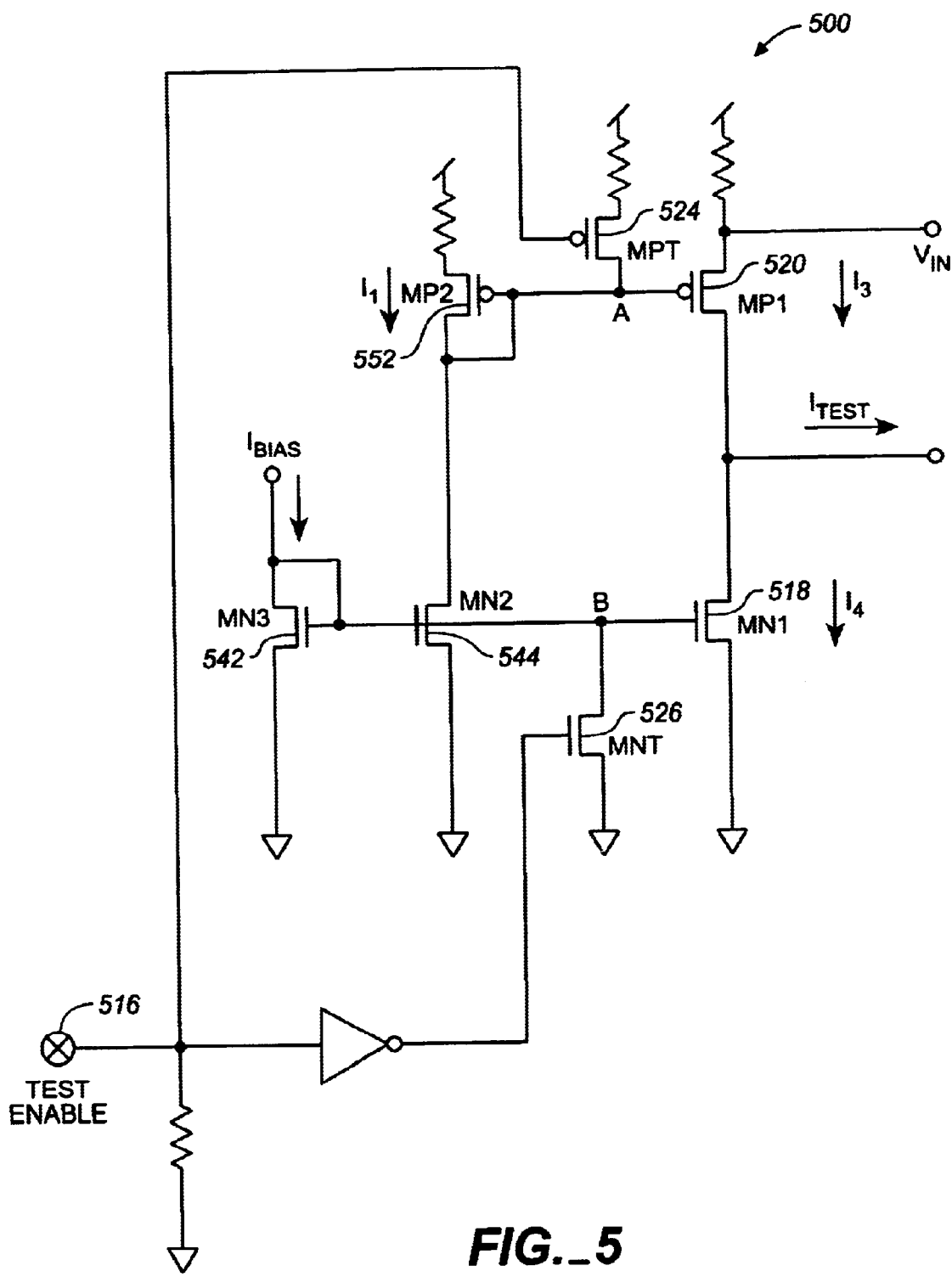
FIG._5

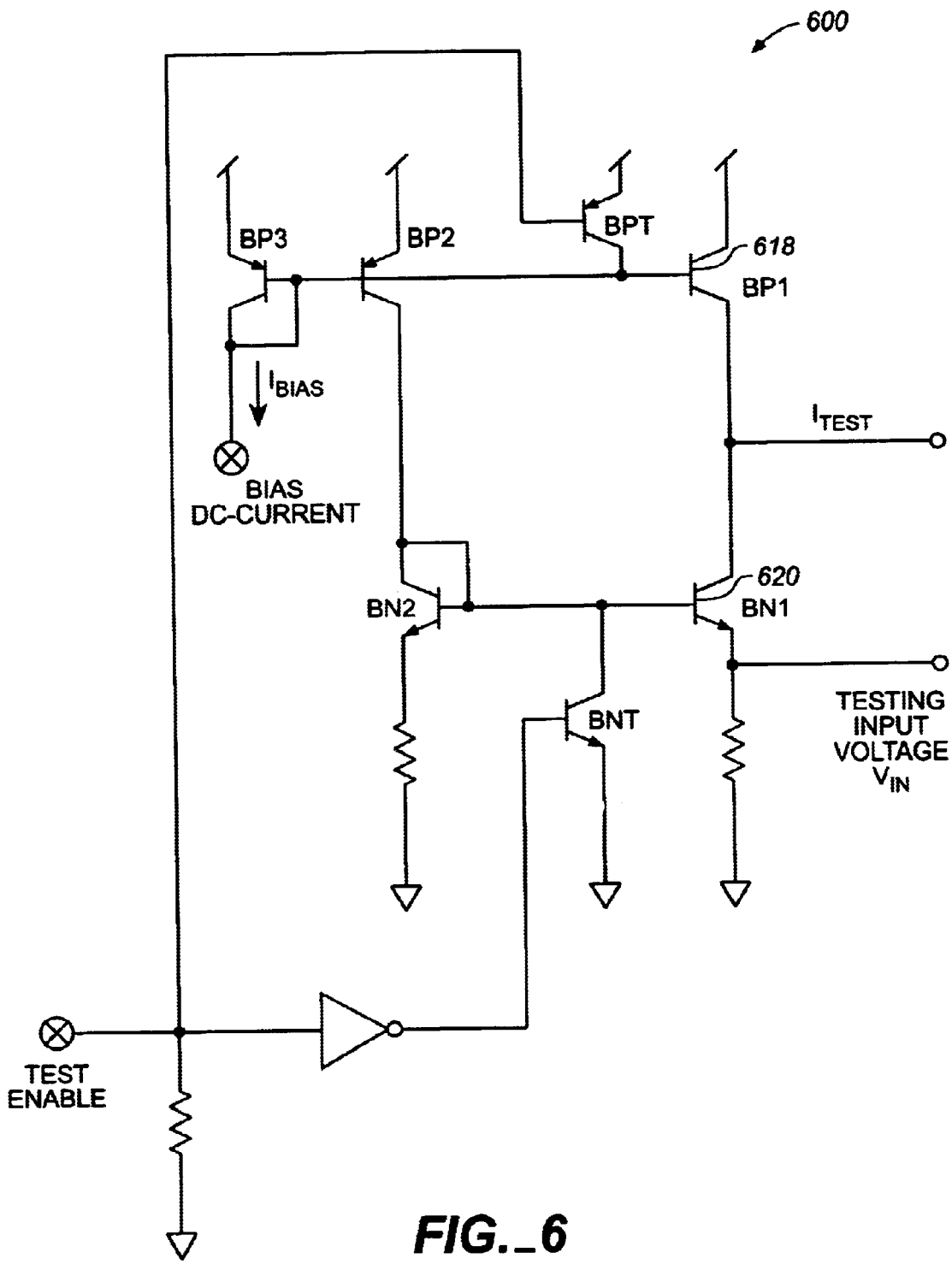
FIG._6

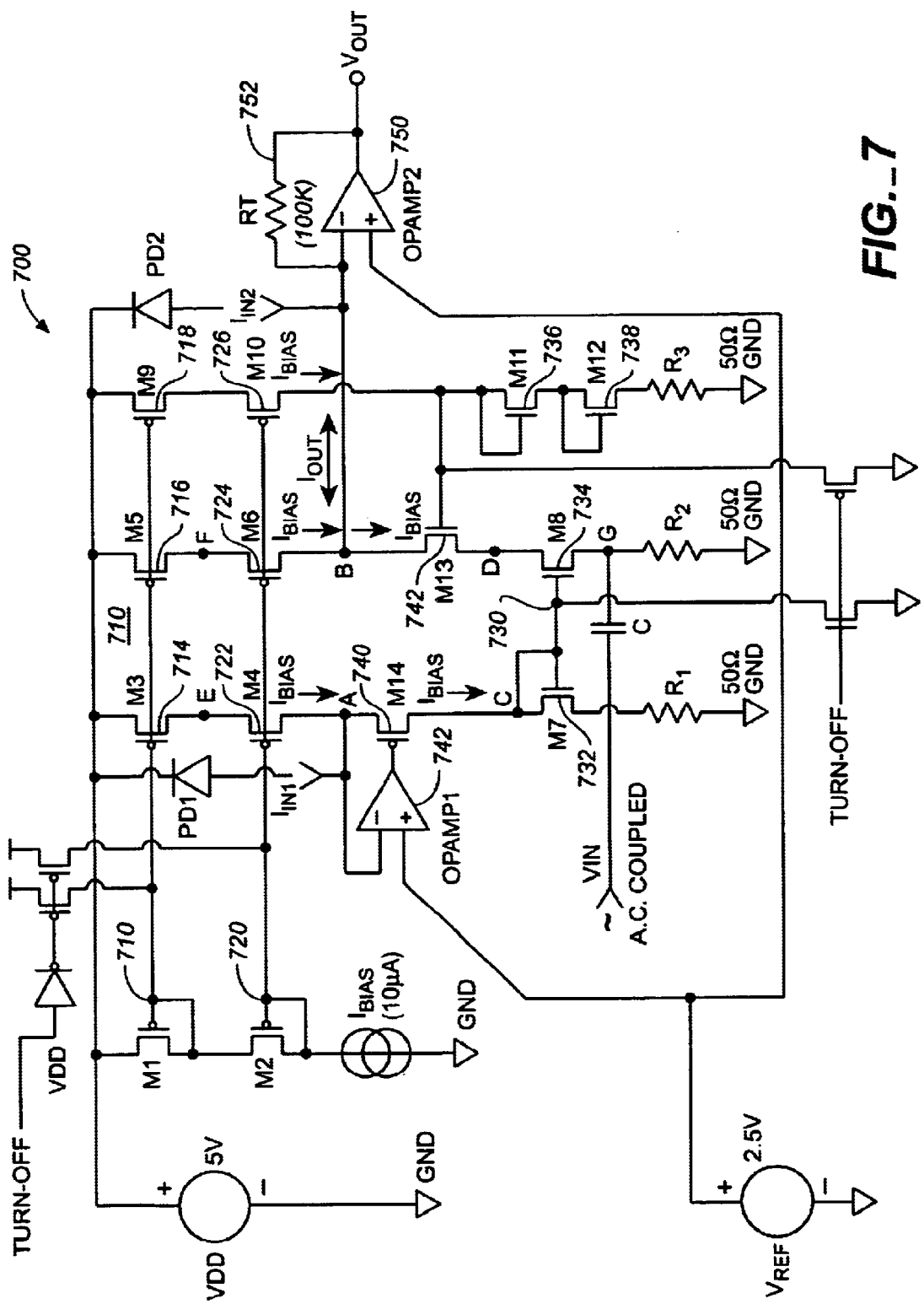
FIG._7

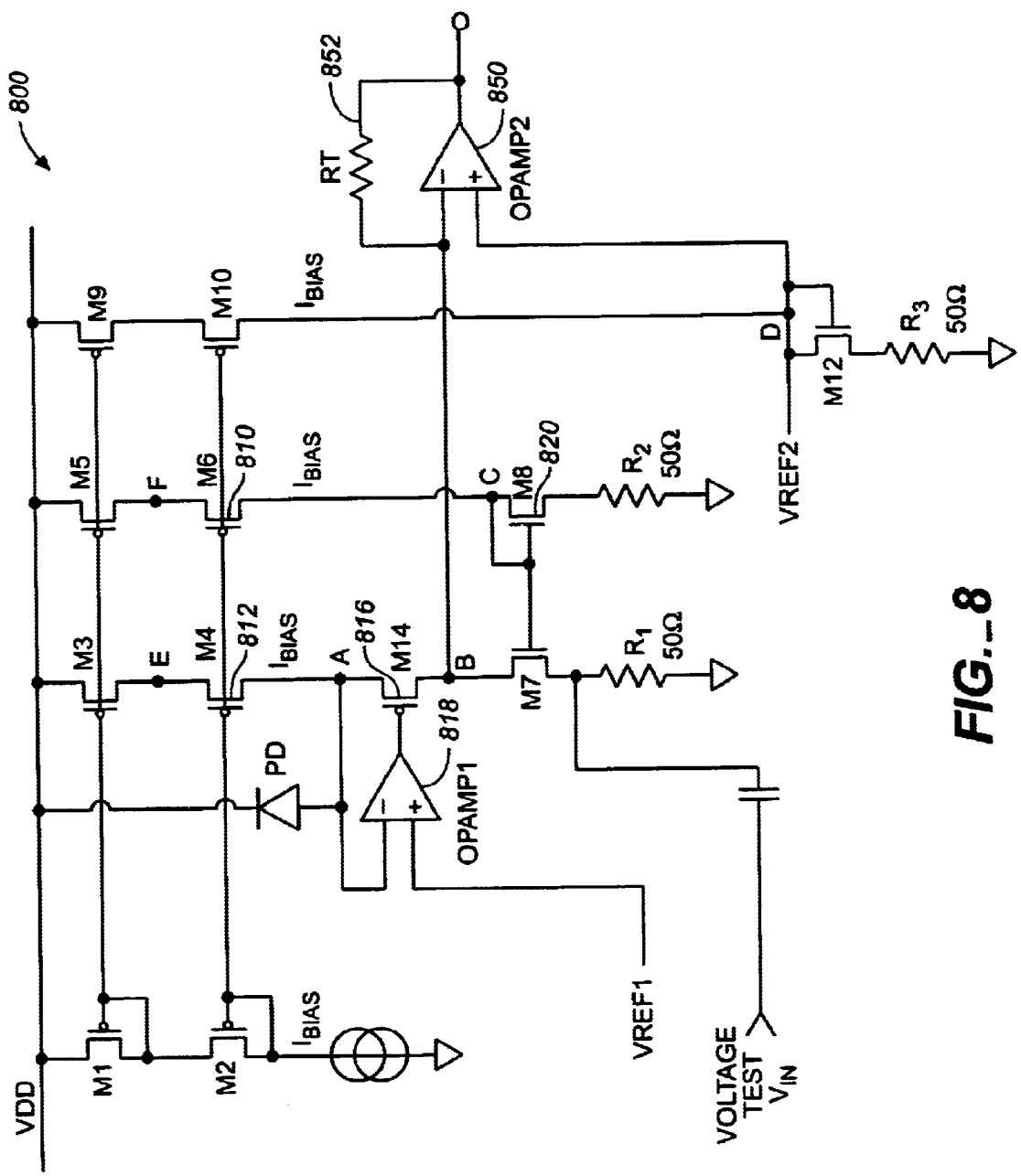
FIG._8

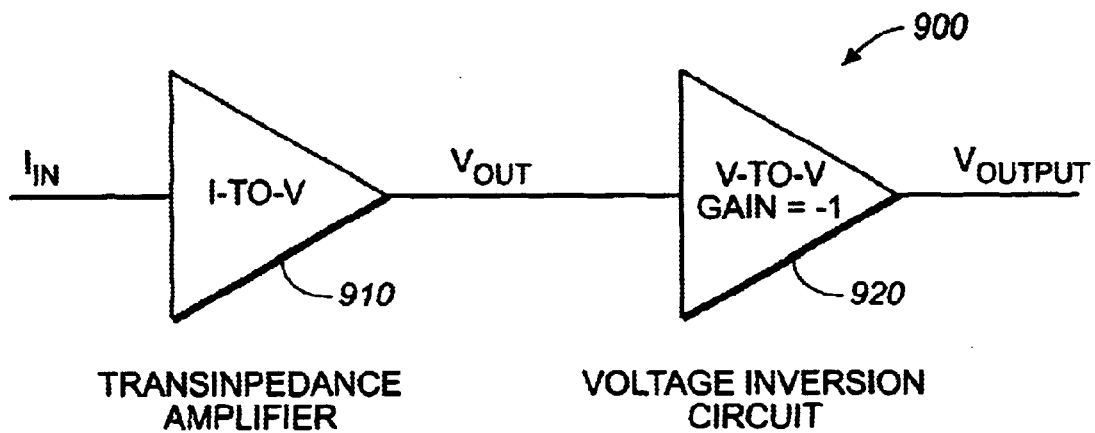
FIG._9
*(PRIOR ART)*
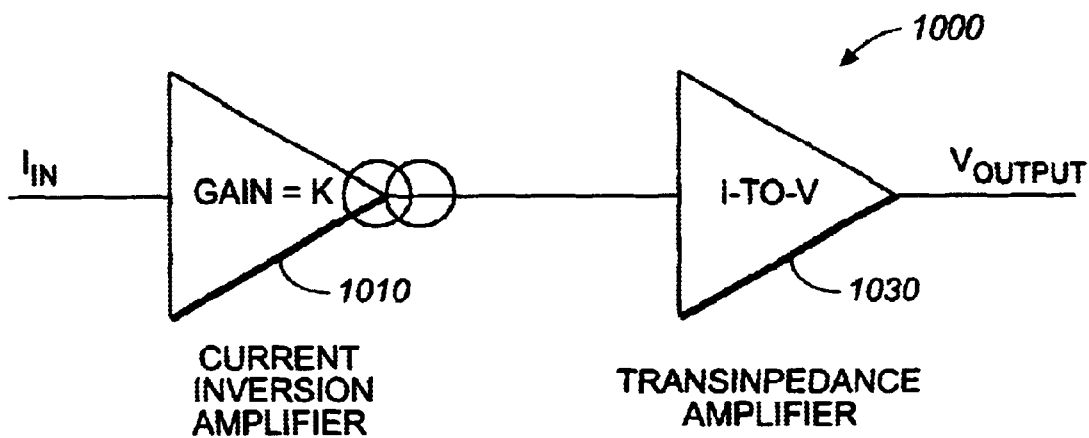
FIG._10

BIST FOR TESTING A CURRENT-VOLTAGE CONVERSION AMPLIFIER

BACKGROUND OF THE INVENTION

This invention relates to a circuit for testing current voltage conversion amplifiers designed for use with photo diodes. It is a primary object of the present invention to provide a circuit for testing a current-voltage conversion amplifier having a photodiode without exposing light to the photodiode. Conventionally, the current voltage conversion amplifiers can also be called as transimpedance amplifiers.

FIG. 1 shows a conventional transimpedance amplifier 100 having a photodiode 110 connected to the input terminal 121 of the amplifier 120. When the photodiode 110 is exposed to light, the photodiode 110 sinks (sources) a current I from (to) the transimpedance amplifier 120. The current is then converted into a voltage $V_{OUT}$ at the output terminal by the transimpedance amplifier 120. The output voltage of the transimpedance amplifier 120 is proportional to the light intensity received by the photodiode 110. Generally the photodiode 110 and transimpedance amplifier 120 combination can be incorporated into a single integrated circuit, onto the same semiconductor substrate material. This is the current trend of systems-on-a-chip, or systems integration. In these cases, the testing of the transimpedance amplifier 120 becomes an issue.

Conventionally, the testing of the photodiode-and-transimpedance-amplifier combination can only be performed by actually exposing the photodiode 11—to light and then obtaining an output voltage from the transimpedance amplifier 120 output, because no external (test-input) access pin can be placed at the connection between the photodiode 110 and the transimpedance amplifier 120, due to capacitive loading effect. Such external test-input access pin would capacitively load the circuit at the opto-electronic interface, and would severely limit the transmission bandwidth for both the normal communication mode and for the test mode.

Conventional testing, consisting of exposing the photodiode to light, requires accurate control of the optical-signal light intensity and of the ambient light intensity, during the entire testing procedure. The testing is not desired to be performed in the integrated circuit processing environment (wafer testing for instance) because of inconvenience and high cost. It is desirable to have a testing device to test the transimpedance amplifier using only electric signals and components (and neither using optical signals nor using optical components).

U.S. Pat. No. 5,585,731, issued to Tsuchida et al. (hereinafter "Tsuchida")is directed to a test circuit for testing a transimpedance amplifier. The test circuit accepts an input voltage and then causes a test current to be drawn from the transimpedance amplifier. FIG. 2 shows a design of the Tsuchida's test circuit 200. The Tsuchida's test circuit 200 comprises a current mirror circuit 210 having two NPN (or PNP) transistors for generating a test current. However, the capacitive loading by the Tsuchida's test circuit greatly reduces the frequency response of the overall circuitry. Therefore, a new design of a test circuit for the transimpedance amplifier is needed.

SUMMARY OF THE INVENTION

It is therefore an object of the present invention to provide a novel method and apparatus to test a transimpedance amplifier.

It is a further object of the present invention to perform in-circuit testing of the integrated optical transimpedance amplifier without the need to expose the photodiode to different light intensities, and without the need to disconnect the photodiode from the transimpedance amplifier.

It is another object of the present invention to provide a testing circuit for testing the transimpedance amplifier without creating a high capacitance loading to the amplifier.

It is a further object of the present invention to integrate the testing circuit with the signal (path) circuit.

It is the object of this invention to have the test circuit configured symmetrically balanced, such that there is no DC current component flowing to/from the transimpedance amplifier input and causing DC offset voltage at the transimpedance amplifier output in the absence of any signals.

It is therefore another object of the present invention to provide a testing circuit that is simple in design and is able to be built on the same common semiconductor substrate as that of the photodiode and as that of the transimpedance amplifier.

The present invention discloses a two-stage transimpedance circuit in which the first stage (i.e. a current mirror) performs dual function. This innovative dual function first stage design comprises a balanced, symmetrical, current mirror stage. According to the present invention, the first stage of the amplifier can either work as a high-frequency current mirror for mirroring current signals from the photodiode to the transimpedance amplifier, or being used as a BIST circuit for testing the transimpedance amplifier connected to the photodiode, in which case the mirror accepts voltage inputs from an outside test pin and the photodiode is not exposed to light. No switching is required to activate/deactivate the test mode (it is always on).

Specifically, this dual-function current mirror stage (hereinafter "DFCM stage")of the present invention comprises an output driver having two complementary transistors connected in series. Each of these two complementary transistors is part of one current mirror of two pairs of current mirrors internal to this circuit. According to the present invention, the two current mirrors are connected in series such that a same DC bias current flows through both two complementary transistors of the output driver. Thus, the DC output offset current of the DFCM circuit is minimal, and is only depending on the device geometries of the two output transistors. Typically, the DFCM output offset currents are 1/1000 to 1/10000 of the DFCM bias current.

Furthermore, according to another aspect of the present invention, each of the transistors in the two current mirrors pair inside the DFCM is buffered by a series transistor to form a cascode design. Two advantages are obtained by utilizing this cascode topology.

First, the cascode configuration reduces by a factor of 1000 to 10000 the DC current mismatch associated with the current mirrors inside the DFCM and present, if any, at the output of the DFCM. Specifically, the cascode devices cancel the Early effects (mismatches) inside the internal current mirrors of the DFCM by equalizing the $V_{DS}$ bias points of the mirror devices.

In addition, the cascode configurations also improves the overall AC frequency bandwidth of the DFCM. The cascode devices eliminate the Miller capacitance effects on the transistors in the output stage of the DFCM. Therefore, the BIST circuit achieves very high frequency response (e.g. 4 GHz for a typical 0.6 µm CMOS process).

These and other objects and features of the invention will be better understood by reference to the detailed description which follows, taken together with the drawings in which like elements are referred to by like designations throughout the several views.

BRIEF DESCRIPTION OF THE INVENTION

FIG. 1 shows a conventional photodiode and current-to-voltage conversion circuit combination. The current-to-voltage conversion is achieved by a single transimpedance stage: the operational amplifier with feedback resistor.

FIG. 2 shows a test current generator disclosed by prior art. The full parasitic collector capacitance of device Q2 is loading the $I_{TEST}$ circuit node (the photodiode is connected to $I_{TEST}$)

FIG. 3 shows a preferred embodiment of a built-in self test according to the present invention.

FIG. 4 shows a preferred embodiment of a test current generator according to the present invention.

FIG. 5 shows another preferred embodiment of a test current generator according to the present invention.

FIG. 6 shows yet another preferred embodiment of a test current generator using bipolar transistors according to the present invention.

FIG. 7 shows another preferred embodiment of a test current generator according to the present invention. Here, the current mirrors are fully balanced, yielding zero (<10 nA) DC offset current at the mirror output, $I_{OUT}$.

FIG. 8 shows another preferred embodiment of the BIST circuit according to the present invention.

FIG. 9 shows a conventional arrangement of a current-voltage conversion circuit.

FIG. 10 shows a novel arrangement of a current-voltage conversion circuit according to the present invention.

DETAILED DESCRIPTION OF THE INVENTION

The present invention describes a two-stage, dual-function, current-to-voltage amplifier circuit (or transimpedance amplifier) for opto-electronic interface. The current-to-voltage amplifiers according to the present invention are designed for use with integrated photodiodes. The transimpedance amplifier according to the preferred embodiment of the present invention is able to perform either of the functions discussed below:

1. Photodiode current-to-voltage high-frequency conversion and signal amplification. This is the transimpedance function in which the current from the photodiode is converted to an amplified voltage.
2. Electrical-only, not optical, high-frequency testing of the current-to-voltage transimpedance gain. This is the test function in which the photodiode will remain connected to the circuit, without being exposed to light. And this reemphasiss the following: the test function is always ON. In other words, it does not require a switch to turn it ON or OFF.

A. Transimpedance Function

According to the present invention, the systematic DC voltage offset at the amplifier output, $V_{OUT}$, with no optical or electrical input signals applied, is guaranteed to be zero (equal to $V_{REF}$) within a few mV (less than 10 mV). Particularly, in the preferred embodiment, few tens of nA offset-current times the transimpedance value of few hundred K ohms equals few mV: 10 nA×100 K ohms=1 mV.

In the preferred embodiment, the design of the transimpedance amplifier comprises the following steps:

a. The circuit design for the high-frequency current mirror (first stage, inverting) utilizes minimum-size MOS devices (devices with minimum L and W).

b. The circuit must overcome the systematic current mismatch caused by identical devices having different $V_{DS}$ voltages.

c. In common design practice, larger-than-minimum devices are used for better current matching. Systematic mismatch of minimum geometry devices is caused by the Early effect (finite, low, output impedance, $R_{DS}$)

d. The current mirror design in the first stage of the amplifier cancels out offsets caused by the Early effects predominant in the minimum-L devices used by the mirror design. It forces equal $V_{DS}$ voltages on the essential transistors in the current mirrors by utilizing cascode (series) connected devices.

e. Minimum size device utilization implies only technology and layout dependency: it is design independent Therefore this design topology is scalable and it can be shrunk as the MOS process technology advances to faster and smaller device sizes without the need for redesign (no need for circuit topology changes).

f. The design of the preferred embodiment maximizes the high-frequency signal bandwidth, in virtue of minimizing the L-and-W area-and-periphery parasitic capacitance of transistors M13 and M6 in the mirror-stage MOS devices in FIG. 7.

B. Testing Function

The second function provided by the amplifier according to the present invention is the in-circuit testing of the high frequency transimpedance amplifier by electrical means without resort to optical test setup. This is possible due to the same cascode topology of the first stage. In the preferred embodiment, the bandwidth of the path of the electrical voltage test signal is a few Ghz. This electrical testing path has a frequency response exceeding the opto-electronic signal bandwidth by an order of magnitude. Generally, the opto-electronic signal bandwidth is defined by the following conversion steps:

First, the optical communication signal applied to the photodiode input is converted by the photodiode to high-frequency current. Then, the photodiode output current is applied to the first stage (i.e. the current mirror) which converts an input current to an output current. Afterward, the current mirror output current is applied to the input of the second stage (i.e. the transimpedance amplifier). Finally, the transimpedance amplifier converts the current to output signal voltage.

FIG. 3 shows a preferred embodiment of a built-in self test ("BIST")circuit for testing a transimpedance amplifier according to the present invention.

The present invention as shown in FIG. 3 comprises three separate components, preferably resided in a same substrate: a standard transimpedance amplifier 310; a photodiode 320 connected to the transimpedance amplifier 310 for providing a current in response to the light intensity applied to the photodiode; and a BIST circuit (i.e. the DFCM stage) 330 for generating a test current for testing the transimpedance amplifier 310.

It should be pointed out that the circuit as shown in FIG. 3 has the photodiode anode connected to ground and the photodiode cathode connected to $I_{TEST}$ (the photodiode is reversed biased). A complementary photodiode design having the photodiode cathode connected to a positive supply and the photodiode anode connected to $I_{TEST}$ (the photodiode remains reversed biased) can also be implemented similarly. This implementation should be obvious for one skilled in the art.

In this preferred embodiment as shown in FIG. 3, the transimpedance amplifier 310 comprises an operational amplifier connected as shown. The amplifier 310 is called a "transimpedance amplifier" because the amplifier converts a current to a voltage according to the following equation: $V_{OUT}=I_{IN}*Z$ where Z is the equivalent impedance of resistor R and capacitor $C_X$. During normal operation, the photodiode 320 generates a current $I_{IN}$ in response to the intensity of the light source. The photodiode current, $I_{IN}$, is applied to the transimpedance amplifier to be converted to a output voltage (i.e. $V_{OUT}$). Finally, the light intensity can then be determined by measuring the output voltage $V_{OUT}$.

According to the preferred embodiment of the present invention, the following steps are taken to test the transimpedance amplifier 310:

1. First, the photodiode 320 is maintained in a stable, dark environment without light and without optical signals.
2. Then, the BIST voltage signal is applied so that a known predetermined test-current $I_{TEST}$ is provided to the transimpedance amplifier via VAST signal. (i.e. $I_{TEST}=V_{TEST}/50$ ohm, wherein the 50 ohm resistor is the internal termination resistance inside the integrated circuit being tested).
3. The operation of the transimpedance amplifier can be confirmed by monitoring the transimpedance amplifier output voltage.

FIG. 4 shows a BIST circuit 400 of a preferred embodiment according to the present invention. The BIST circuit 400 as shown comprises a test voltage input 412 for providing the BIST circuit with an input test voltage $V_{IN}$. The BIST circuit 400 then converts the input test voltage $V_{IN}$ to a corresponding test current $I_{TEST}$ at the output terminal 414. The test current $I_{TEST}$ is provided to the transimpedance amplifier (not shown). In the preferred embodiment shown, the BIST circuit 400 is designed with an optional test-enable terminal 416 for selectively enabling/disabling the BIST circuit. Disabling the BIST circuit shuts off both output transistors MP1 418, MN1 420, so that the BIST circuit incurs minimal capacitive loading to the transimpedance amplifier (not shown). In the preferred embodiment, the BIST circuit 400 is provided with a DC bias current terminal 422 for biasing the two output transistors MP1 418, MN1 420 so that they work in saturation (high output impedance) when the BIST circuit 400 is enabled. Optimal (i.e. maximum) frequency response of the BIST circuit 400 is obtained by operating the two output transistors as current sources (i.e. in saturation). Transistor MN1 420 operates as a cascode connected device for the $V_{IN}$ test signals, providing maximum bandwidth. Compared to Tsuchida's test circuit as shown in FIG. 2 that uses a common-emitter or common-source configuration, the BIST configuration in FIG. 4 has MN1 420 transmitting the test signal as cascode. The cascode connection has much wider frequency response than the common-emitter/common-source configuration.

As discussed above, the test enable terminal 416 is provided as an option for selectively turning on/off the BIST circuit. In the preferred embodiment as shown in FIGS. 4 and 5, the test-enable terminal 416 is normally pulled down so that the BIST circuit is normally in the non-operative state. During the normal operation, point A is pulled up by transistor MPT 424, and point B is pulled down by transistor MNT 426. Therefore, both transistors MP1 418 and MN1 420 are shut off so that the BIST circuit 400 is in a high-impedance, OFF, state. By shutting off both transistors MP1 418 and MN1 420, the DC current offset effect of the BIST circuit 4 onto the transimpedance amplifier is minimized. The capacitive loading on the transimpedance amplifier by the BIST circuit 400 is based on the device geometries of the two output transistors MP1 418, MN1 420.

Normally, the capacitive loading of the transimpedance amplifier by the BIST circuit is about 5 fento farads (combined total $C_{DRAIN}$ parasitic of MN1 418 and MP1 420).

When the BIST circuit 400 is enabled by pulling the test enable terminal 416 high, both transistors MPT 424 and MNT 426 are turned off so that normal operation of the BIST circuit can be performed.

One important aspect of the present invention is the application of the DC bias current $I_{BIAS}$ to the two output transistors MP1 418, MN1 420. In the preferred embodiment as shown in FIG. 4, the bias current applied to the transistor pair MP1 418 and MN1 420 is generated by a complementary current mirror design. The complementary current mirror design comprises two current mirrors: the first current mirror 440, and the second current mirror 450. The first current mirror 440 comprises the transistors MP3 442, MP2 444, and MP1 418, where the current flowing through each of the transistors MP2 444 and MP1 418 (i.e. I1, I3) mirrors the current flowing through the transistor MP3 442 (i.e. $I_{BIAS}$). The second current mirror 450 comprises the transistors MN2 452 and MN1 420, where the current flowing through the transistor MN1 420 (i.e. I4) mirrors the current flowing through the transistor MN2 452 (i.e. I2). As shown in the figure, and because of the connections between the transistors MP2 444 and MN2 452, the currents flowing between the transistors MP1 418 and MN1 420 are substantially the same and equal to the $I_{BIAS}$ DC-current applied to the BIST circuit (i.e. I1=I2=I3=I4). This assumes that the MP1-2-3 and MN1-2 devices have the same L, W, geometry. If the devices geometries are scaled, a current multiplication can be implemented, such that I3=I4=k*I1=k*I2=k*$I_{BIAS}$, where the constant k is a geometric ratio between device sizes. The multiplication is easily understood by those skilled in the art.

The AC testing current generated by the BIST circuit 400 as $I_{TEST}$, is in a linear relationship with the AC input test-voltage $V_{IN}$ applied at the source of the cascode connected device, MN1 420, for $V_{IN}$ amplitudes of up to few hundred millivolts (i.e. small signal).

Another aspect of the present invention is the arrangement of the input test voltage $V_{IN}$ and the two output transistors MPN 418, MN1 420. In this preferred embodiment, the two transistors are connected in series as shown in FIG. 4. The test voltage $V_{IN}$ can be applied to either end of the two serially connected driving transistors MP1 418, MN1 420. In this embodiment as shown in FIG. 4, the test voltage is applied to the source of the transistor MN1 420. With proper DC bias of transistor MN1 420, by the DC bias current $I_{BIAS}$, the output test current, $I_{TEST}$ is in linear relationship to the applied small-signal AC test voltage $V_{IN}$. Transistor MN1 used in the preferred embodiment as shown operates as a common gate transistor (cascode), having a wide frequency response to the applied test voltage $V_{IN}$.

By applying the input test voltage $V_{IN}$ to transistor MN1 420 in a common gate arrangement as shown, the capacitive loading to the subsequent transimpedance amplifier 400 is reduced to a minimum because of the elimination of the Miller effect.

On the other hand, in the conventional design shown in FIG. 2, the capacitance loading at the base of Q2 is high due to the Miller effect. Specifically, the capacitance loading equals to the base-collector capacitance Cbc of Q2 multiplied by the gain of the circuitry. In the preferred embodiment of the present invention, the common gate arrangement of transistor MN1 420 eliminates the Miller effect and the parasitic capacitance multiplication. Thus, the BIST circuit 400 provides a wide band frequency response for providing a test current to the transimpedance amplifier. Particularly, the BIST circuit 400 of the preferred embodiment converts an AC test voltage $V_{IN}$ to a test current, $I_{TEST}$, while maintaining a high frequency bandwidth.

FIG. 5 shows another preferred embodiment of the BIST circuit 500 according to the present invention. The embodiment as shown is a PMOS implementation of the BIST circuit, based on the preferred embodiment as shown in FIG. 4. According to this embodiment, the test input voltage $V_{IN}$ is applied to the source of PMOS output transistor MP1 520. The DC bias current $I_{BIAS}$ is provided to transistor MN3 542 instead of the transistor MP3 442 of FIG. 4. The operating principle is substantially the same as that of the embodiment shown in FIG. 4. The BIST circuit 500 as shown in FIG. 5 provides a wide bandwidth, AC test current for the transimpedance amplifier.

FIG. 6 shows another preferred of the BIST circuit 600 according to the present invention. The BIST circuit 600 as shown is implemented with bipolar transistors instead of MOS transistors as shown in FIG. 4 and in FIG. 5. The design of the BIST circuit 600 in FIG. 6 is similar to the embodiment shown in FIG. 4. The complementary current mirror is built using bipolar transistors instead of MOS transistors as shown in FIG. 4. The bipolar transistors are operating substantially the same as those in the MOS version. Instead of the common gate-design for output transistor MN1 420 shown in FIG. 4, this embodiment employs a common base design for NPN transistor BN1 620, so that the frequency bandwidth of the test signal passing through BN1 620 remains high, due to elimination of the Miller capacitor. Thus, wide operating bandwidth can be assured by providing minimum capacitive parasitic in the path of the test signal.

It should be noted that a complementary embodiment to the BIST circuit as shown in FIG. 5 using bipolar transistors can be implemented similarly. In this case, the PMOS transistors used in the BIST circuit as shown in FIG. 5 will be replaced with PNP bipolar transistors whereas the NMOS transistors used will be replaced with NPN bipolar transistors.

FIG. 7 shows another preferred embodiment of the BIST circuit 700 according to the present invention. This BIST circuit design incorporates both the dual-function of photodiode signal current mirror as discussed in the previous paragraphs, and the voltage testing function of the transimpedance amplifier with an AC input voltage. No switching is required to enable or disable the test circuit (or the test circuit function).

Similar to the preferred embodiment shown in FIG. 4, the preferred embodiment in FIG. 7 employs the two-current-mirrors 710,730 structure M3–M5 PMOS 710 and M7–M8 NMOS 730, but with additional four devices: three PMOS transistors M4–M6 722,724,726, M14 740 and one NMOS transistor M13 742. This circuit topology greatly reduces the systematic DC output current offset at point B (i.e. $I_{OUT}$) by canceling the Early effects in the top current mirror M3–M5 710, and in the bottom current mirror, M7–M8 730.

In the preferred embodiment, all devices in FIG. 7 have similar minimum-size L and W. Scaling currents through geometry scaling is possible and is desired for noise reduction. For ease of explanation and for better understanding, the following description assumes 1-to-1 current mirror ratio, and assumes all devices being identical (operating at identical current densities).

The transimpedance amplifier as shown in FIG. 7 comprises two stages: The first state is the dual-function current mirror comprises a fourteen MOS devices: M1-through-M14. The second stage comprises the transimpedance amplifier OPAMP2 with a trans-resistance $R_T$.

The followings describe the DC-Output Current Offset Cancellation in the first stage of the transimpedance amplifier according to the present invention:

A. First-order Early Effect Cancellation in Top Current Mirror, M3-M5, Circuit Nodes E–F The PMOS transistor pair M4–M6 is cascode connected to the first current mirror pair, M3–M5. In this preferred embodiment, the cascode design helps maintain a constant voltage at points E–F. Points E–F are the current mirror outputs (drains of M3–M5). The design makes equal the $V_{DS}$ voltage of current mirror transistors, M3 and M5. These transistors will have the same output resistance. There will be no current mismatch in this mirror, no output resistance mismatch degradation caused by the Early effect, and no unequal drain-source voltages. The equality $R_{DS}3=R_{DS}5$ is obtained from the cascode mirror design, from making equal $V_{DS}3=V_{DS}5$ via transistors M4-and-M6 being placed as cascode devices for M3-and-M5.

B. First-order Early Effect Cancellation in Bottom Current Mirror, M7–M8 Circuit Nodes C–D The NMOS transistor M1 3 is cascode connected to transistor M8 of the second current mirror pair, M7–M8. In this preferred embodiment, the cascode design helps maintain a constant voltage at points C–D. Points C–D are the current mirror input-output (drains of M7–M8). The design goal is to have the two current mirror transistors, M7 and M8, have equal output resistance. Transistors M7–M8 have no output resistance mismatch degradation caused by the Early effect (unequal drain-source voltages). The equality $R_{DS7}=R_{DS8}$ is obtained from the cascoded mirror design, from making equal $V_{DS7}=V_{DS8}$ via transistors M13–M11–M12, where M13 is cascode device for M8. Device M7 is diode-connected so that $V_{DS7}=V_{GS7}$. The M8 drain voltage is equal to $V_{DS8}=V_{GS12}+V_{GS11}-V_{GS13}$. As assumed by the note discussed above, all devices operate at equal current densities and have identical sizes. Thus, all $V_{GS}$ are equal. Therefore $V_{DS7}=V_{GS}$ and $V_{DS8}=2^*V_{GS}-V_{GS}=V_{GS}$, or $V_{DS7}=V_{DS8}$, which forces the M7–M8 current mirror to operate at identical drain voltages, canceling the Early effect current mismatch (current offset). Devices M9–M10 provide bias current for devices M11–M12.

C. Second-order Early Effect Cancellation in the Top Current Mirror, M3–M5, Circuit Nodes A–B The PMOS transistor pair M4–M6 is cascode connected to the first current mirror pair, M3–M5. This cascode design helps maintain a constant voltage at points E–F. Points A–B are the current mirror outputs (drains of M4–M6). A secondary design goal is to have the two current mirror cascode transistors M4 and M6 suffer no output resistance mismatch degradation caused by the Early effect (unequal drain-source voltages). In other words, $V_A=V_B$. In the present invention, the equality $R_{DS}4=R_{DS}6$ is achieved by forcing $V_{DS}4=V_{DS}6$ via two wide-band operational amplifiers operating as unity-gain voltage buffers for points A and B, as follows (see FIG. 7).

Another aspect of the present invention is the combination of the operational amplifier OPAMP1 742 and the PMOS transistor M14 740. In the preferred embodiment as shown, the operational amplifier OPADP1 742 and PMOS transistor M14 740 combination forces the voltage at point A to be equal to $V_{REF}$. On the other hand, the operational amplifier OPAMP2 and trans-resistance $R_T$, force the voltage at point B to be equal to $V_{REF}$.

In the present design, operational amplifier OPAMP1 742 performs a dual-function by following the designs of

A. Voltage Follower Output at Node A

Operational amplifier OPAMP1 742 and PMOS transistor M14 740 are connected in a voltage follower configuration as shown. This circuit design forces the voltage at point A to be equal to, or to follow voltage $V_{REF}$. The voltage at circuit node A thus follows the $V_{REF}$ voltage. This operational amplifier property is called "virtual ground" and is familiar to those skilled in the art (here, the term "ground" means AC ground, and is the $V_{REF}$ voltage source reference, which is an AC short or "ground"). The benefit is the elimination of the second-order output current offset in the mirror made with PMOS transistors M3–M5–M4–M6.

B. Reduction of Photodiode parasitic Capacitor Effect on the Frequency Bandwidth of the Current Mirror, M1-to-M14

Operational amplifier OPAMP1 742 with PMOS transistor M14 740 create a low-impedance point at circuit node A (A is the source of PMOS transistor M14). The impedance at node A is equal to the inverse of the M14 transconductance, $gm_{M14}$, multiplied by the open-loop voltage gain of OPAMP1 742, $G_{VOPAMP1} \gg 1$. In conventional designs, the photodiode is connected only to the source of a MOS device.

In the conventional design:
AC-impedance at node $A=1/gm_{M14}$
This new approach:
AC-impedance at node $A=1/(G_{VOPAMP1}*gm_{M14})$ The benefit of the preferred embodiment is the widening of the frequency response of the photodiode and current mirror stage (M1-to-M14), from the photodiode's current-input node, A, to the mirror's current-output node, B. The frequency pole created by the photodiode capacitance, $C_{PD1}$, is translated to a higher frequency:

In the conventional design:
Frequency pole at node $A=C_{PD1}/gm_{M14}$
This new approach:
Frequency pole at node $A=C_{PD1}/(G_{VOPAMP1})*gm_{M14})$ This new circuit topology effectively reduces of the photodiode capacitance by a factor equal to the open-loop voltage gain of OPAMP1, $G_{VOPAMP1}$:

$$C_{PD1EFFECTIVE}=C_{PD1}/G_{VOPAMP1}$$

And the new frequency pole at node A becomes= $C_{PD1EFFECTIVE}/gm_{M14}$

This novel technique of driving the photodiode (PD1, optical sensor) with an operational amplifier output, (node A is the output of a voltage follower), is named "current tunneling" or "current spitting". The voltage potential at node A is kept "frozen" by OPAMP1 742 with M14 740.

The present design is a method for extending the bandwidth of the transimpedance circuits. Effectively PMOS transistor M14 740 with OPAMP1 742 tunnel the photodiode current from A to C. The impedance at circuit nodes A–C–D–B (in the signal path) is kept low, minimizing the parasitic capacitor effects that would otherwise limit the frequency bandwidth. In conclusion, the present design topology:

1. fixes the DC voltage at node A and suppresses the AC voltage at node A;
2. does not allow AC voltage variations across the photodiode;
3. does not allow the photodiode capacitance to charge or discharge (photodiode with large parasitic capacitance may thus be used);
4. "tunnels" the optically-induced excess or deficit current, from the source of M14, through M14, and to the drain of M14, at circuit node C;
5. keeps node C at low impedance, $1/gm_{M7}$, and the signal frequency path from node A through node C is maintained as a wide frequency path, since the parasitic capacitors are not seeing high-impedance nodes at A nor C,
6. cancels the current offset in mirror M7–M8 and lowers the impedance of node D; and
7. transistor M13 both cancels the DC current offset of mirror M7–M8 (nodes C–D at same voltage, no Early effect) and is an AC cascode for device M8, lowering the impedance at node D (providing high bandwidth at node D)

In the present design, the circuit node B is kept at the fixed voltage $V_{REF}$ by the transimpedance amplifier OPAMP2 750 and resistor $R_T$ 752. The impedance at node B is $R_T/G_{VOPAMP2}$ where the open-loop voltage gain of OPAMP2 750, $G_{VOPAMP2} \gg 1$.

As shown in the figure, an AC-test voltage input node is provided at the source of NMOS transistor M8 and 50 ohms resistor (on-chip terminator) R2. This point is left open when no testing function is desired. Then the onchip 50 ohm terminating resistor R2 shunts any noise to the ground. The resistors R1 and R3 of FIG. 7; the resistance values are chosen so that R1=R3=R2=50 ohms are provided for mirror matching. In addition, the frequency response and bandwidth testing can be performed by applying an AC voltage signal from a 50 ohms, wide-band, frequency generator. In this preferred design, there is no test circuit to be turned off. Similarly, the current mirror stage M1-to-M14 provides a wide-bandwidth dual function: First, the current-to-current mirror function for the photodiode signals, path A–C–D–B. And the function of providing input voltage for voltage test signals with voltage-to-current conversion, path D–B It should be noted that the embodiment as shown in FIG. 7 can be modified for PMOS and bipolar transistors implementations as in FIG. 5 and FIG. 6. Furthermore, the operational amplifier OPAMP1 and the PMOS M14 can also be added to each of the two embodiments as shown in FIG. 5 and FIG. 6.

FIG. 8 shows another preferred embodiment of the BIST circuit 800 according to the present invention. This circuit design incorporates in one circuit block the dual-function of photodiode signal current tunneling, and that of voltage testing with AC input voltage.

Similar to the preferred embodiment shown in FIG. 7, the preferred embodiment in FIG. 8 employs the two-current-mirrors structure M3–M5 PMOS 810 and M7–M8 NMOS 820, with cascode devices M4 812, M6 814, M14 816 and one NMOS transistor M13. This circuit topology greatly reduces the systematic DC output current offset at point B ($I_{OUT}$), as explained below, by canceling the Early effects in the top current mirror M3–M5, and in the bottom current mirror, M7–M8.

Note that all devices in FIG. 8 have similar minimum-size L and W. The following description assumes 1-to-1 current ratios, and assumes all devices being identical (operating at identical current densities).

The transimpedance amplifier in FIG. 8 has two stages: The first stage is the dual-function current tunneling MOS device M14 816. The second stage is the transimpedance amplifier OPAMP2 850 with trans-resistance $R_T$ 852.

The followings describe the DC-Output Current Offset Cancellation in the first stage (of the transimpedance amplifier):

A. First-order Early Effect Cancellation in Top Current Mirror, M3–M5, Circuit Nodes E–F The PMOS transistor pair M4–M6 is cascode connected to the first current mirror pair, M3–M5. In this preferred embodiment, the cascode design helps maintain a constant voltage at points E–F. Points E–F are the current mirror outputs (drains of M3-M5). The design makes equal the $V_{DS}$ voltage of current mirror transistors, M3 and M5. These transistors will have the same output resistance. There will be no current mismatch in this mirror, no output resistance mismatch degradation caused by the Early effect, no unequal drain-source voltages. The equality $R_{DS3}=R_{DS5}$ is obtained from the cascoded mirror design, from making equal $V_{DS3}=V_{DS5}$ via transistors M4-and-M6 being placed as cascode devices for M3-and-M5.

B. First-order Early Effect Cancellation in Bottom Current Mirror, M7–M8, Circuit Nodes B–C–D Points B and C are the current mirror output-input (drains of M7–M8). The design goal of this preferred embodiment is to have the two current mirror transistors, M7 and M8 providing equal output resistance. Transistors M7–M8 have no output resistance mismatch degradation caused by the Early effect (i.e. unequal drain-source voltages). The equality $R_{DS7}=R_{DS8}$ is obtained from making equal $V_{DS8}=V_{DS7}$ via diode-connected transistor M12 and OPAMP2 with trans-resistor $R_T$. Through the virtual-ground property, OPAMP2 forces node B to voltage track node D. Device M8 is diode-connected, so $V_{DS8}=V_{GS8}$. The M7 drain voltage (node B) is equal to $V_{DS7}=V_{REF2}=V_{DS12}=V_{GS12}=V_{GS}$. As assumed by the note discussed above, all devices operate at equal current densities, and have identical sizes, and all $V_{GS}$ are equal. Therefore $V_{DS8}=V_{GS8}=V_{GS}$, or $V_{DS7}=V_{DS8}$, which forces the M7–M8 current mirror to operate at identical drain voltages. By having identical drain voltages, he Early effect current mismatch (current offset) is thereby canceled. In this preferred embodiment, devices M9–M10 provide bias current for device M12.

C. The Followings Describe the Second-order Early Effect Cancellation in Top Current Mirror, M3–M5, Circuit Nodes A–C In this preferred embodiment, there is no second-order Early effect. The PMOS transistor pair M4–M6 is cascode connected to the first current mirror pair, M3–M5. This cascode design helps maintain a constant voltage at points E–F. Points A–C are the current mirror outputs (drains of M4–M6).

Similarly, the combination of operational amplifier OPAMP1 818 and PMOS transistor M14 816, forces the voltage at point A to be equal to $V_{REF1}$. Operational amplifier OPAMP2 850 and trans-resistance $R_T$ 852, force the voltage at point B to be equal to $V_{REF2}$.

In this preferred embodiment, operational amplifier OPAMP1 818 performs a single-function by design.

Reduction of photodiode parasitic capacitor effect on the frequency bandwidth of the current tunneling input stage, nodes A–B, device M14. Operational amplifier OPAMP1 818 with PMOS transistor M14 816 create a low-impedance point at circuit node A (A is the source of PMOS transistor M14). The impedance at node A is equal to the inverse of the M14 transconductance, $gm_{M14}$, multiplied by the open-loop voltage gain of OPAMP1 818, $G_{VOPAMP1}\gg1$. In conventional designs the photodiode is connected only to the source of a MOS device.

In the conventional design:
AC-impedance at node A=$1/gm_{M14}$
This new approach:
AC-impedance at node A=$1/(G_{VOPAMP1}*gm_{M14})$ The benefit is the widening of the frequency response of the photodiode and current tunneling stage, M14; from the photodiode's current-input node, A, to the output node, B. The frequency pole created by the photodiode capacitance CPD1 is translated to a higher frequency:

Conventional design:
Frequency pole at node A=$C_{PD1}/gm_{M14}$
This new approach:
Frequency pole at node A=$C_{PD1}/(G_{VOPAMP1}*gm_{M14})$ This new circuit topology reduces of the photodiode capacitance by a factor equal to the open-loop voltage gain of OPAMP1 818, $G_{VOPAMP1}$:

$$C_{PD1EFFECTIVE}=C_{PD1}/G_{VOPAMP1}$$

The new frequency pole at node A becomes= $C_{PD1EFFECTIVE}/gm_{M14}$

This novel technique of driving the photodiode (PD1, optical sensor) with an operational amplifier output, (node A is the output of a voltage follower), is named "current tunneling" or "current spitting". It is a wide-bandwidth method for extending the frequency band for transimpedance circuits. Effectively PMOS transistor M14 816 with OPAMP1 818 tunnel the photodiode current from A to B. The impedance at circuit nodes A–B (in the signal path) is kept low, minimizing the parasitic capacitor effects that would otherwise limit the frequency bandwidth. This design topology:

1. fixes the DC voltage at node A;
2. does not allow AC voltage variations across the photodiode;
3. does not allow the photodiode capacitor to charge or discharge;
4. "tunnels" the optically-induced excess or deficit current, from the source of M14 (node A), through M14, and to the drain of M14 (node B); and
5. cancels the current offset in mirror M7–M8. Transistor M12, OPAMP1, and RT cancel the DC current offset of mirror M7–M8 (nodes B–C–D at same voltage, no Early effect at B–C).

Circuit node B is kept at the fixed voltage $V_{REF2}$ by the transimpedance amplifier OPAMP2 and resistor $R_T$. Node B impedance is $R_T/G_{VOPAMP2}$ where the open-loop voltage gain of OPAMP2, $G_{VOPAMP2}\gg1$.

An AC-test voltage input node is provided at the source of NMOS transistor M7 and 50 ohms resistor (i.e. on-chip terminator), R1. Here, in FIG. 8, the resistors R1 and R2, R1=R3=R2=50 ohms are provided for mirror matching. Frequency response and bandwidth testing can be performed by simply applying an AC voltage signal from a 50 ohms wide-band, frequency generator. In this preferred embodiment, there is no test circuit to be turned off. Most importantly, the current tunneling stage M14 provides a wide-bandwidth dual function:

1. current-to-current tunneling for the photodiode signals, path A–B; and
2. input for voltage test signals with voltage-to-current conversion, path M7-B.

FIGS. 9 and 10 further illustrate one important aspect of the present invention.

FIG. 9 shows a conventional arrangement of a current-voltage conversion circuit 900. As shown in the figure, the current-voltage conversion circuit 900 comprises two stages. The first stage is a transimpedance amplifier 910, whereas the second stage is voltage inversion circuit 920. First, an input current $I_{IN}$ is provided by a photodiode (not shown) to the transimpedance amplifier 910. The transimpedance amplifier 910 converts the input current $I_{IN}$ into an output voltage $V_{OUT}$ for the next stage. Since an inverted output voltage (i.e. $-V_{OUT}$) is normally required for the subsequent circuitry, the output voltage $V_{OUT}$ is then fed to a voltage inversion circuit 920 for voltage inversion. The voltage inversion circuit 920 basically is an amplifier having a gain of negative one. Thus, the resulting output $V_{OUTPUT}$ of the current-voltage conversion circuit as shown is an output voltage inversely proportional to the input current $I_{IN}$ provided by the photodiode.

FIG. 10 shows a novel arrangement of a current-voltage conversion circuit 1000 according to the present invention. As discussed in the previous paragraphs, the present invention discloses a BIST circuit connected between the photodiode and the transimpedance amplifier 1020 for generating a BIST current for testing the transimpedance amplifier 1020. Particularly, as shown in FIG. 7, the BIST circuit comprises a current mirror pair comprising the transistors M7 732 and M8 734 for current mirroring and amplification. Due to this current mirror pair, the output current generated by this BIST circuit is inversely proportional to the input current $I_{IN}$ from the photodiode. Thus, FIG. 10 illustrates this aspect of the present invention by showing a current inversion amplifier 1010 positioned between the photodiode and the transimpedance amplifier 1020 for inversely amplifying the input current $I_{IN}$. As shown in FIG. 10, this current inversion amplifier 1010 is located between the photodiode and the transimpedance amplifier 1020 such that the voltage inversion circuit 920 of FIG. 9 can be eliminated.

It is to be understood that while the invention has been described above in conjunction with preferred specific embodiments, the description and examples are intended to illustrate and not limit the scope of the invention, which is defined by the scope of the appended claims.

What is claimed is:

1. A dual function circuit for providing an input current to a transimpedance amplifier, said dual function circuit being able to selectively operate in a normal function or a test function, comprising:

a first current mirror having an input port and an output port, the first current mirror sinking or sourcing currents from the input port of the first current mirror and the output port of the first current mirror to a virtual ground via a first and a second load respectively;

a second current mirror receiving an input bias current, the second current mirror having a first and a second output port, the first output port of the second current mirror operable to control current coupled into the input port of the first current mirror;

a voltage follower, the voltage follower having at least one input port and an output node coupled to the second output port of the second current mirror, the voltage follower comprising an amplifier and an output transistor, the output transistor having a control terminal coupled to the amplifier, a first current terminal coupled to the node and a second current terminal coupled to the output port of the first current mirror;

a signal port for receiving a signal current from a photo-sensor, the signal port coupled to the output transistor of the voltage follower; and a test signal input port coupled to the second load;

wherein current sourced or sunk at the output node of the voltage follower determines the input current at the transimpedance amplifier.

2. The dual function circuit according to claim 1 is a BIST circuit.

3. The dual function circuit according to claim 1, wherein the selection between the normal function and the test function does not require any off-circuit select signal.

4. The dual function circuit according to claim 1 wherein the voltage follower is operable to tunnel the signal current from the output node to the second current terminal of the output transistor, whereby the voltage follower substantially prevents error due to capacitive loading at the signal port.

5. The dual function circuit according to claim 1 wherein the signal port is coupled to the second current terminal of the output transistor.

6. The dual function circuit according to claim 1 or claim 4, wherein the signal port is coupled to the output node.

7. A dual function circuit for providing an input current to a transimpedance circuit, said dual function circuit being able to selectively operate in a normal function or a test function, comprising:

a voltage follower having a low impedance output at a circuit node;

a first current mirror sourcing or sinking a first current equal to a bias current at the circuit node;

a second current mirror sinking or sourcing, at the node, a second current equal to a current selected from a list consisting of the bias current and a test signal current;

a photo-sensor coupled to the node; and an output current port carrying an output current wherein the input current to the transimpedance circuit is responsive to the output current wherein selection of the second current is performed by activating the test signal current.

8. The circuit of claim 7 wherein:

the second current mirror employs cascode stages.

9. The circuit of claim 7 wherein:

the dual function circuit is embodied as a single integrated circuit chip.

10. The circuit of claim 7 wherein:

the photo-sensor is a photo-diode.

11. The circuit of claim 7 wherein:

the circuit has a bandwidth of at least 4 GHz and may be embodied using a CMOS process for design rules of at least 0.6 micron.

12. The circuit of claim 7 wherein:

the circuit is embodied in MOS technologies.

13. The circuit of claim 7 wherein:

the circuit is embodied in bipolar technologies.

14. A dual function circuit for providing an input current to a transimpedance circuit, said dual function circuit being able to selectively operate in a normal function or a test function, comprising:

a voltage follower having a low impedance output at a circuit node;

a first current mirror sourcing or sinking a first current equal to a bias current at the circuit node;

a second current mirror sinking or sourcing, at the node, a second current equal to a current selected from a list consisting of the bias current and a test signal current;

a photo-sensor coupled to the node; and an output current port carrying an output current wherein the input current to the transimpedance circuit is responsive to the output current wherein selection of the second current is performed by at least one switching transistor in the path of the bias current.

15. A circuit for supply a signal to a current-driven load comprising:
- a means for creating a constant voltage low impedance circuit node;
- a means for sourcing a first current into the node;
- a means for sinking a second current from the node;
- a photo-sensitive means for sourcing or sinking a third current at the node responsive to an optical intensity; and
- a means for sourcing or sinking a fourth current at the node wherein the fourth current controls the current-driven load;
- wherein the first current is equal to a bias current and the second current is equal to the bias current or a test signal current.

16. A circuit for a current-driven load comprising:
- a means for creating a constant voltage low impedance circuit node;
- a means for a sinking first current into the node;
- a means for sourcing a second current from the node;
- a photo-sensitive means for sourcing or sinking a third current at the node responsive to an optical intensity; and
- a means for sourcing or sinking a fourth current at the node wherein the fourth current controls the current-driven load;
- wherein the first current is equal to a bias current and the second current is equal to the bias current or a test signal current.

* * * * *